(12) United States Patent
Anvekar et al.

(10) Patent No.: US 7,992,059 B2
(45) Date of Patent: Aug. 2, 2011

(54) SYSTEM AND METHOD FOR TESTING A LARGE MEMORY AREA DURING PROCESSOR DESIGN VERIFICATION AND VALIDATION

(75) Inventors: Divya Subbarao Anvekar, Karnataka (IN); Shubhodeep Roy Choudhury, Karnataka (IN); Manoj Dusanapudi, Karnataka (IN); Sunil Suresh Hatti, Karnataka (IN); Shakti Kapoor, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 437 days.

(21) Appl. No.: 11/853,212

(22) Filed: Sep. 11, 2007

(65) Prior Publication Data

US 2009/0070643 A1   Mar. 12, 2009

(51) Int. Cl.
*G11C 29/00* (2006.01)
*G06F 11/00* (2006.01)

(52) U.S. Cl. ......... 714/718; 714/720; 714/735; 714/742

(58) Field of Classification Search .......... 714/718, 714/719, 724, 733, 734, 738; 365/200, 201
See application file for complete search history.

(56) References Cited

U.S. PATENT DOCUMENTS

| | | | | |
|---|---|---|---|---|
| 4,800,486 A | | 1/1989 | Horst | 364/200 |
| 4,910,663 A | | 3/1990 | Bailey | 714/34 |
| 5,133,061 A | | 7/1992 | Melton et al. | 711/128 |
| 5,182,811 A | | 1/1993 | Sakamura | 710/264 |
| 5,202,889 A | | 4/1993 | Aharon | 371/27 |
| 5,216,672 A | * | 6/1993 | Tatosian et al. | 714/718 |
| 5,218,703 A | | 6/1993 | Fleck et al. | 710/264 |
| 5,331,643 A | * | 7/1994 | Smith | 714/728 |
| 5,396,619 A | * | 3/1995 | Walton | 714/8 |
| 5,426,750 A | * | 6/1995 | Becker et al. | 711/207 |
| 5,469,443 A | * | 11/1995 | Saxena | 714/720 |
| 5,488,573 A | | 1/1996 | Brown | 364/578 |
| 5,584,013 A | | 12/1996 | Cheong et al. | 711/122 |
| 5,701,495 A | | 12/1997 | Arndt et al. | 710/263 |
| 5,761,408 A | | 6/1998 | Kolawa | 714/38 |

(Continued)

FOREIGN PATENT DOCUMENTS

JP   2000020341 A2   1/2000

(Continued)

OTHER PUBLICATIONS

Hubbard, PJ, "Memory Testing With Linear Feedback Shift Register," IBM Technical Disclosure Bulletin, 11-86 p. 2475, 1986.

(Continued)

*Primary Examiner* — Cynthia Britt
*Assistant Examiner* — Daniel F McMahon
(74) *Attorney, Agent, or Firm* — VanLeeuwen & VanLeeuwen; Matthew B. Talpis

(57) ABSTRACT

A system and method for replicating a memory block throughout a main memory and modifying real addresses within an address translation buffer to reference the replicated memory blocks during test case set re-executions in order to fully test the main memory is presented. A test case generator generates a test case set (multiple test cases) along with an initial address translation buffer that includes real addresses that reference an initial memory block. A test case executor modifies the real addresses after each test case set re-execution in order for a processor to test each replicated memory block included in the main memory.

20 Claims, 9 Drawing Sheets

U.S. PATENT DOCUMENTS

| | | | | |
|---|---|---|---|---|
| 5,784,550 | A | 7/1998 | Brockmann et al. | 714/33 |
| 5,784,606 | A | 7/1998 | Hoy et al. | 714/33 |
| 5,784,698 | A | 7/1998 | Brady et al. | 711/171 |
| 5,815,696 | A | 9/1998 | Tanaka et al. | 712/233 |
| 5,822,578 | A | 10/1998 | Frank et al. | 712/244 |
| 5,996,097 | A * | 11/1999 | Evans et al. | 714/719 |
| 6,006,028 | A | 12/1999 | Aharon et al. | 703/21 |
| 6,014,756 | A | 1/2000 | Dottling et al. | 714/15 |
| 6,019,501 | A * | 2/2000 | Okazaki | 714/718 |
| 6,070,220 | A | 5/2000 | Katayama | 710/264 |
| 6,157,980 | A | 12/2000 | Arimilli et al. | 711/3 |
| 6,167,479 | A | 12/2000 | Hartnett et al. | 710/260 |
| 6,212,613 | B1 | 4/2001 | Belair | 711/207 |
| 6,223,271 | B1 * | 4/2001 | Cepulis | 711/206 |
| 6,223,337 | B1 | 4/2001 | Blume | 717/4 |
| 6,226,716 | B1 | 5/2001 | Bauman et al. | 711/145 |
| 6,253,338 | B1 | 6/2001 | Smolders | 714/45 |
| 6,286,116 | B1 | 9/2001 | Bhavsar | 714/720 |
| 6,367,042 | B1 | 4/2002 | Phan | 714/733 |
| 6,381,715 | B1 * | 4/2002 | Bauman et al. | 714/718 |
| 6,609,216 | B1 | 8/2003 | Almy et al. | 714/25 |
| 6,662,297 | B1 | 12/2003 | Boom et al. | 712/245 |
| 6,675,338 | B1 | 1/2004 | Golshan | 714/739 |
| 6,684,359 | B2 | 1/2004 | Noy | 714/741 |
| 6,694,461 | B1 * | 2/2004 | Treuer | 714/719 |
| 6,701,461 | B2 * | 3/2004 | Oura | 714/42 |
| 6,735,746 | B2 | 5/2004 | Thompson et al. | 716/136 |
| 6,865,501 | B2 | 3/2005 | Huisman et al. | 702/117 |
| 6,920,416 | B1 | 7/2005 | Swoboda et al. | 703/13 |
| 6,950,771 | B1 | 9/2005 | Fan et al. | 702/117 |
| 6,968,428 | B2 | 11/2005 | Maly et al. | 711/128 |
| 6,993,685 | B2 | 1/2006 | Ramaswamy | 714/43 |
| 7,010,734 | B2 | 3/2006 | Brahme | 714/724 |
| 7,020,854 | B2 | 3/2006 | Killian et al. | 716/1 |
| 7,058,909 | B2 | 6/2006 | Lu | 716/4 |
| 7,073,106 | B2 * | 7/2006 | Paredes et al. | 714/720 |
| 7,111,287 | B2 | 9/2006 | Garvey | 717/144 |
| 7,133,816 | B2 | 11/2006 | Adir | 703/14 |
| 7,222,179 | B2 | 5/2007 | Srivastava et al. | 709/226 |
| 7,240,243 | B2 | 7/2007 | Decker | 714/33 |
| 7,356,436 | B2 | 4/2008 | Bohizic et al. | 702/119 |
| 7,373,446 | B2 | 5/2008 | Post et al. | 710/261 |
| 7,536,694 | B2 | 5/2009 | Blinick et al. | 719/310 |
| 7,669,083 | B2 | 2/2010 | Arora et al. | 714/25 |
| 7,752,499 | B2 | 7/2010 | Choudhury et al. | 714/25 |
| 7,797,650 | B2 | 9/2010 | Bag et al. | 716/4 |
| 7,831,979 | B2 | 11/2010 | Whalen | 718/108 |
| 2001/0007970 | A1 | 7/2001 | Kohno et al. | 702/117 |
| 2004/0143720 | A1 | 7/2004 | Mansell et al. | 711/206 |
| 2004/0143819 | A1 | 7/2004 | Cheng et al. | 717/125 |
| 2005/0159925 | A1 | 7/2005 | Gedamu | 702/186 |
| 2005/0204231 | A1 * | 9/2005 | Mukherjee et al. | 714/733 |
| 2005/0210452 | A1 | 9/2005 | Dimpsey et al. | 717/120 |
| 2005/0278702 | A1 | 12/2005 | Koyfman et al. | 717/124 |
| 2006/0101181 | A1 | 5/2006 | Post et al. | 710/266 |
| 2006/0149952 | A1 | 7/2006 | Blinick et al. | 712/244 |
| 2006/0161897 | A1 | 7/2006 | Biberstein et al. | 717/124 |
| 2006/0195573 | A1 | 8/2006 | Srivastava et al. | 709/224 |
| 2006/0212756 | A1 | 9/2006 | Emek et al. | 714/30 |
| 2006/0224863 | A1 | 10/2006 | Lovett et al. | 712/215 |
| 2009/0070643 | A1 | 3/2009 | Anvekar et al. | 714/718 |
| 2009/0300441 | A1 * | 12/2009 | Andreev et al. | 714/718 |

FOREIGN PATENT DOCUMENTS

TW 0440765 B 6/2001

OTHER PUBLICATIONS

Arimilli, et al., "High-Performance Combined Data/Address Memory Test," IBM Technical Disclosure, n7 12-90 p. 104-108, 1990.

Notice of allowance for U.S. Appl. No. 11/853,130, mailed Oct. 6, 2009, 8 pages.

Office action for U.S. Appl. No. 11/853,154, mailed May 25, 2010, 10 pages.

Office action for U.S. Appl. No. 11/853,154, mailed Nov. 5, 2010, 8 pages.

Notice of Allowance for U.S. Appl. No. 11/853,154, mailed Feb. 22, 2011, 5 pages.

Office Action for U.S. Appl. No. 11/853,163, mailed Jan. 22, 2010, 6 pages.

Notice of Allowance for U.S. Appl. No. 11/853,163, mailed May 11, 2010, 9 pages.

Office Action for U.S. Appl. No. 11/853,170, mailed Oct. 12, 2010, 7 pages.

Notice of allowance for U.S. Appl. No. 11/853,189, mailed Feb. 22, 2010, 9 pages.

Office Action for U.S. Appl. No. 11/853,208, mailed Jan. 31, 2011, 24 pages.

Notice of Allowance for U.S. Appl. No. 11/853,154, mailed Apr. 18, 2011, 11 pages.

Notice of Allowance for U.S. Appl. No. 11/853,170, mailed Apr. 13, 2011, 7 pages.

Office Action for U.S. Appl. No. 11/853,201, mailed Apr. 14, 2011, 20 pages.

* cited by examiner

200

| TLB | |
|---|---|
| VSID | RA |
| V1 | R1 |
| V2 | R2 |
| V3 | R3 |
| ... | ... |
| Vn | Rn |

| TLB | |
|---|---|
| VSID | RA |
| V1 | R1+x |
| V2 | R2+x |
| V3 | R3+x |
| ... | ... |
| Vn | Rn+x |

FIG. 2B

SYSTEM AND METHOD FOR TESTING A LARGE MEMORY AREA DURING PROCESSOR DESIGN VERIFICATION AND VALIDATION

BACKGROUND OF THE INVENTION

1. Technical Field

The present invention relates to a system and method for testing a large memory area during processor design verification and validation. More particularly, the present invention relates to a system and method for replicating a memory block throughout a main memory and modifying real addresses within a translation lookaside buffer (TLB) to reference the replicated memory blocks during test case set re-executions in order to fully test the main memory.

2. Description of the Related Art

Processor testing tools exist whose goal is to generate the most stressful test case for a processor. In theory, the generated test case should provide maximum test coverage and should be interesting enough to stress various timing scenarios on the processor. The whole technology of these tools sits in the logic of building these test cases.

Verifying and validating a processor using test cases typically includes three stages, which are 1) test case build stage, 2) test case execution stage, and 3) a validation and verification stage. A challenge found is that with an increasing demand for memory, processors reside on boards that include a large amount of memory. In test applications, however, a typical test case at any time only accesses a couple of pages of memory. As a result, a large number of test cases are required to cover large memory areas, which requires a large amount of build time.

What is needed, therefore, is a system and method for efficiently testing a large memory area.

SUMMARY

It has been discovered that the aforementioned challenges are resolved using a system and method for replicating a memory block throughout a main memory and modifying real addresses within a translation lookaside buffer (TLB) to reference the replicated memory blocks during test case set re-executions in order to fully test the main memory. A test case generator generates a test case set (multiple test cases) along with an initial TLB that includes real addresses that reference an initial memory block. A test case executor modifies the real addresses after each test case set re-execution in order for a processor to test each replicated memory block included in the main memory.

A test case generator allocates a fixed memory block size (e.g., 64 KB) and builds a test case set that is biased toward memory access instructions that access an initial memory block whose size equals the allocated fixed memory block size. The test case set includes an initial address translation table, such as a translation lookaside buffer (TLB), which translates virtual addresses to real addresses that reference the initial memory block within the main memory. The test case generator then replicates the initial memory block throughout the main memory.

A test case executor receives the test case set from the test case generator, and schedules the test case set using the initial address translation table. In turn, the test case executor dispatches the test case set, which includes the initial translation table, to a processor. The processor executes the test case set, which tests the initial memory block located in the main memory. When finished, the processor sends hardware results to a results comparator, which evaluates the results and sends a pass or fail message to the scheduler.

When the hardware results pass, the scheduler uses a TLB modifier to modify the TLB real addresses in order to reference the next memory block (replicated memory block). In turn, the scheduler provides the test case set, along with the modified address translation table, to the dispatcher, which dispatches the test case set to the processor. The processor executes the test case set, which tests the next memory block, and passes hardware results to the results comparator.

The test case executor proceeds to modify the address translation table "n" times and dispatch the test case set with the modified translation tables "n" times in order to fully test each memory block included in the main memory. As a result, the test case generator generates one test case set in order to fully test the main memory.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

FIG. 2A is a diagram showing a translation lookaside buffer (TLB) table that includes virtual addresses and corresponding real address that reference an initial memory block;

FIG. 2B is a diagram showing a translation lookaside buffer (TLB) that includes real addresses that are modified to reference a replicated memory block;

DETAILED DESCRIPTION

The following is intended to provide a detailed description of an example of the invention and should not be taken to be limiting of the invention itself. Rather, any number of variations may fall within the scope of the invention, which is defined in the claims following the description.

Figure 1:
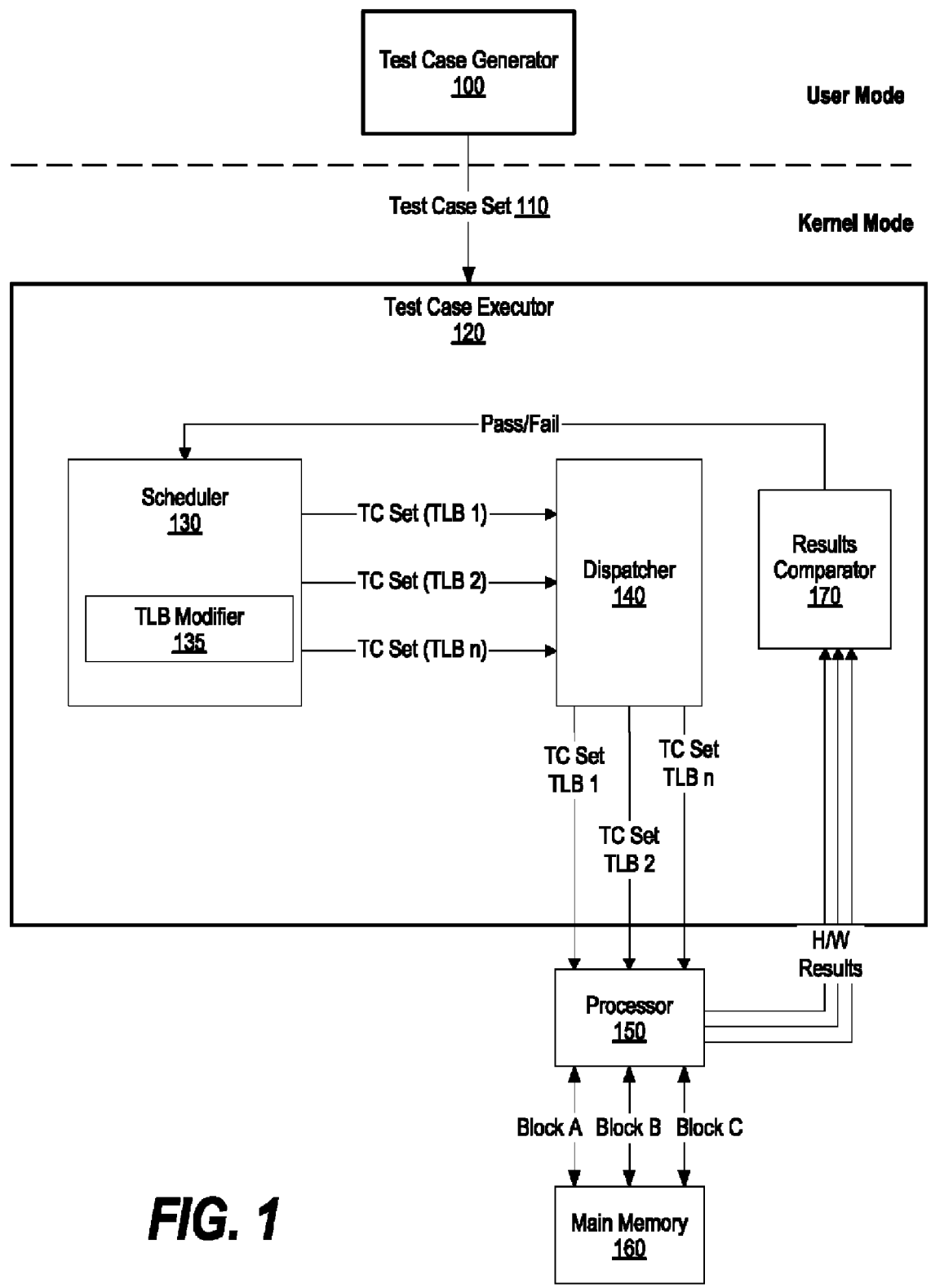
FIG. 1 is a diagram showing a test case executor re-scheduling and re-dispatching a test case set with different address translations in order to fully test a large external memory area.

FIG. 1 is a diagram showing a test case executor re-scheduling and re-dispatching a test case set with different address translations in order to fully test a large external memory area (main memory 160). By using the same test case set and modifying the address translations, a system tester spends less time generating test cases, which allows more time to test processor 150 and main memory 160.

Test case generator 100 operates in a user mode and allocates a fixed memory block size (e.g., 64 KB) to build a test case set to test main memory 160. Test case generator 100 then builds a test case set that is biased toward memory access instructions that access an initial memory block whose size equals the allocated fixed memory block size. Test case set 110 includes an initial address translation table, such as a translation lookaside buffer (TLB), which translates virtual addresses to real addresses that reference the initial memory block within main memory 160. Test case generator 100 then replicates the initial memory block such that the replicated memory blocks cover main memory 160.

In one embodiment, test case set 110 includes a test case that includes a plurality of sub test cases, each of which includes a set of instructions that are organized in a particular instruction order. For example, a test case may include a first sub test case and a second sub test case. The first sub test case may include five instructions that are organized in a particular instruction order, and the second sub test case may include ten instructions that are organized in a particular instruction order. In this embodiment, test case generator 100 allocates processor resource sets to each individual sub test case, and selects instructions to insert into the sub test case based upon the resources allocated to the particular sub test case. In turn, the instructions are shuffled during each test case re-execution (see FIGS. 5, 6, and corresponding text for further details).

Test case executor 120 operates in a kernel/privilege mode, and receives test case set 110 from test case generator 100. Scheduler 130 schedules the test case set using the initial address translation table. In turn, dispatcher 140 dispatches the test case set (TLB 1) to processor 150. Processor 150 executes the test case set, which tests the initial memory block (block A) located in main memory 160. When finished, processor 150 sends hardware results to results comparator 170. Results comparator 170 evaluates the results and sends a pass or fail message to scheduler 130.

When the hardware results pass, scheduler 130 uses TLB modifier 135 to modify the real addresses included in the address translation table. TLB modifier 135 modifies the real address to reference the next memory block (replicated memory block) included in main memory 160. In turn, scheduler 130 provides the test case set, with the modified address translation table (TLB 2) to dispatcher 140, which dispatches the test case set to processor 150. Processor 150 executes the test case set, which tests the next memory block (block B) included in main memory 160. Processor 150 then passes hardware results to results comparator 170, which evaluates the results and sends a pass or fail message to scheduler 130.

Test case executor 120 proceeds to modify the address translation table "n" times and dispatch the test case set with the modified translation tables "n" times in order to fully test each memory block included in main memory 160. As can be seen, test case generator 100 generated one test case set for use in fully testing main memory 160.

FIG. 2A is a diagram showing a translation lookaside buffer (TLB) table that includes virtual addresses and corresponding real addresses that reference an initial memory block. TLB 200 includes virtual segment identifier (VSID) column 210 and real address (RA) column 220. The real addresses included in column 220 reference an initial memory block in a main memory area. Once a test case executor executes a test pattern using TLB 200 and tests the initial memory block, the test case executor modifies the real addresses included in column 220 to point to a different, replicated memory block (see FIG. 2B and corresponding text for further details). The test case executor continues to modify the real addresses in column 220 until each memory block included in the main memory area is tested.

FIG. 2B is a diagram showing a translation lookaside buffer (TLB) that includes real addresses that are modified to reference a replicated memory block. FIG. 2B includes TLB 230, which is the same as TLB 200 (FIG. 2A) with the exception that the real addresses in column 250 that correspond to the virtual addresses in column 240 have been modified (+x) to point to a different memory block. As such, when a test case set uses TLB 230 during its execution, the test case set exercises and tests the replicated memory block that corresponds to the modified real addresses in column 250.

Figure 3:
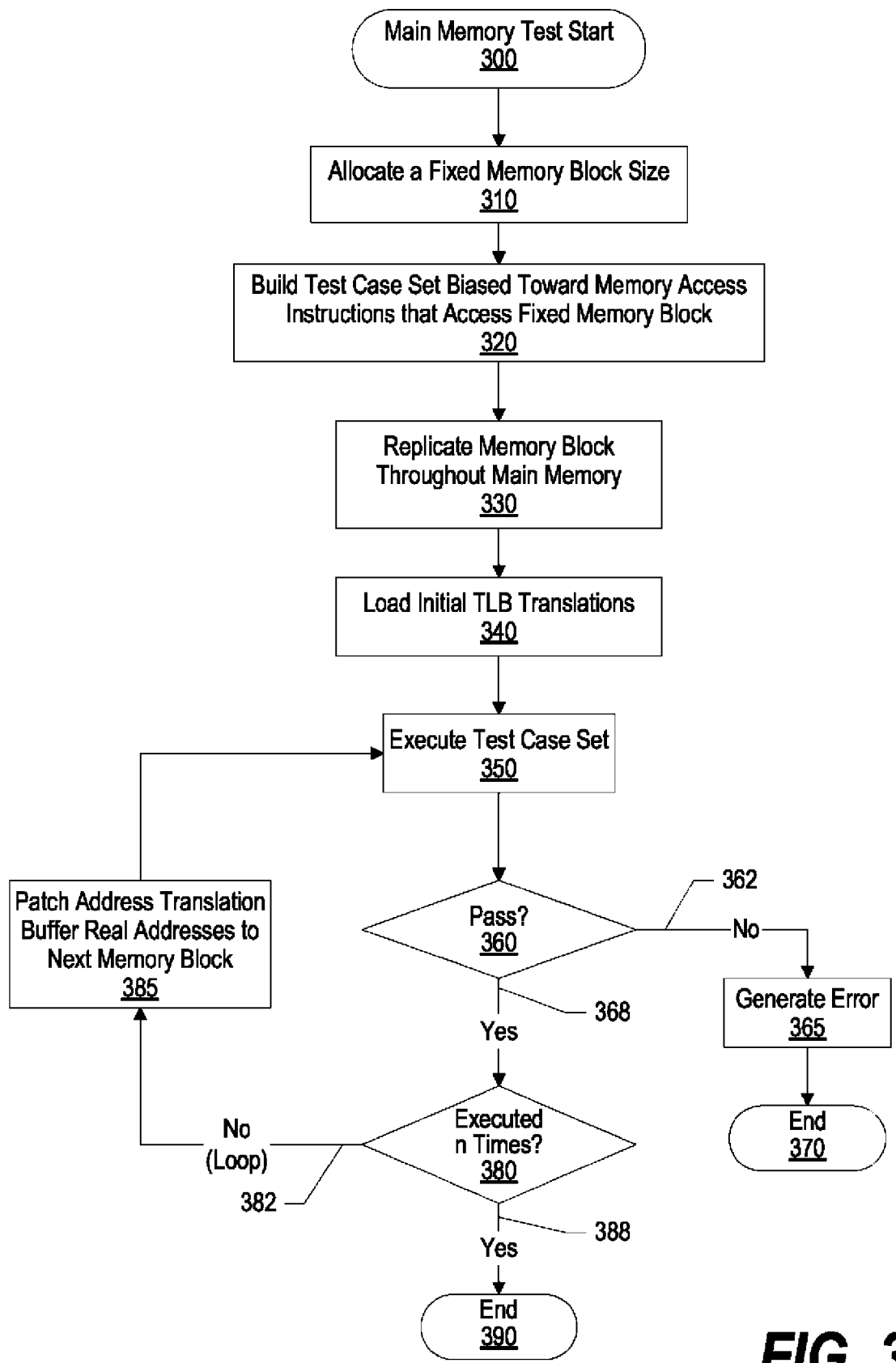
FIG. 3 is a flowchart showing steps taken in generating a test case set and replicating a memory block in order to test a large memory area.

FIG. 3 is a flowchart showing steps taken in generating a test case set and replicating a memory block in order to test a large memory area. Processing commences at 300, whereupon processing allocates a fixed memory block size at step 310, such as a 64 KB block size. Next, processing builds a test case set (multiple test cases) that is biased toward memory access instructions that access an initial memory block whose size corresponds to the allocated fixed memory block size (step 320). At step 330, processing replicates the initial memory block throughout the main memory (see FIG. 4 and corresponding text for further details).

At step 340, processing loads initial address translations, which reference the initial memory block, into a translation lookaside buffer (TLB). Next, processing executes the test case set at 350 using the TLB that includes the initial address translations.

Once a processor executes the test case set, which tests the initial memory block included in the main memory, a determination is made as to whether the test case set passed (decision 360). If the test case set did not pass, decision 360 branches to "No" branch 362 whereupon processing generates an error at step 365, and ends at 370.

On the other hand, if the test case set passed, decision 360 branches to "Yes" branch 368, whereupon a determination is made as to whether the test case set has executed "n" times to fully test each replicated memory block within the main memory area (decision 380). If the test case set has not executed "n" times, decision 380 branches to "No" branch 382 whereupon processing patches the TLB real address to reference the next memory block in the main memory area (step 385), and executes the test case using the patched TLB. This looping continues until the test case set has executed "n" times, at which point decision 380 branches to "Yes" branch 388 whereupon processing ends at 390.

Figure 4:
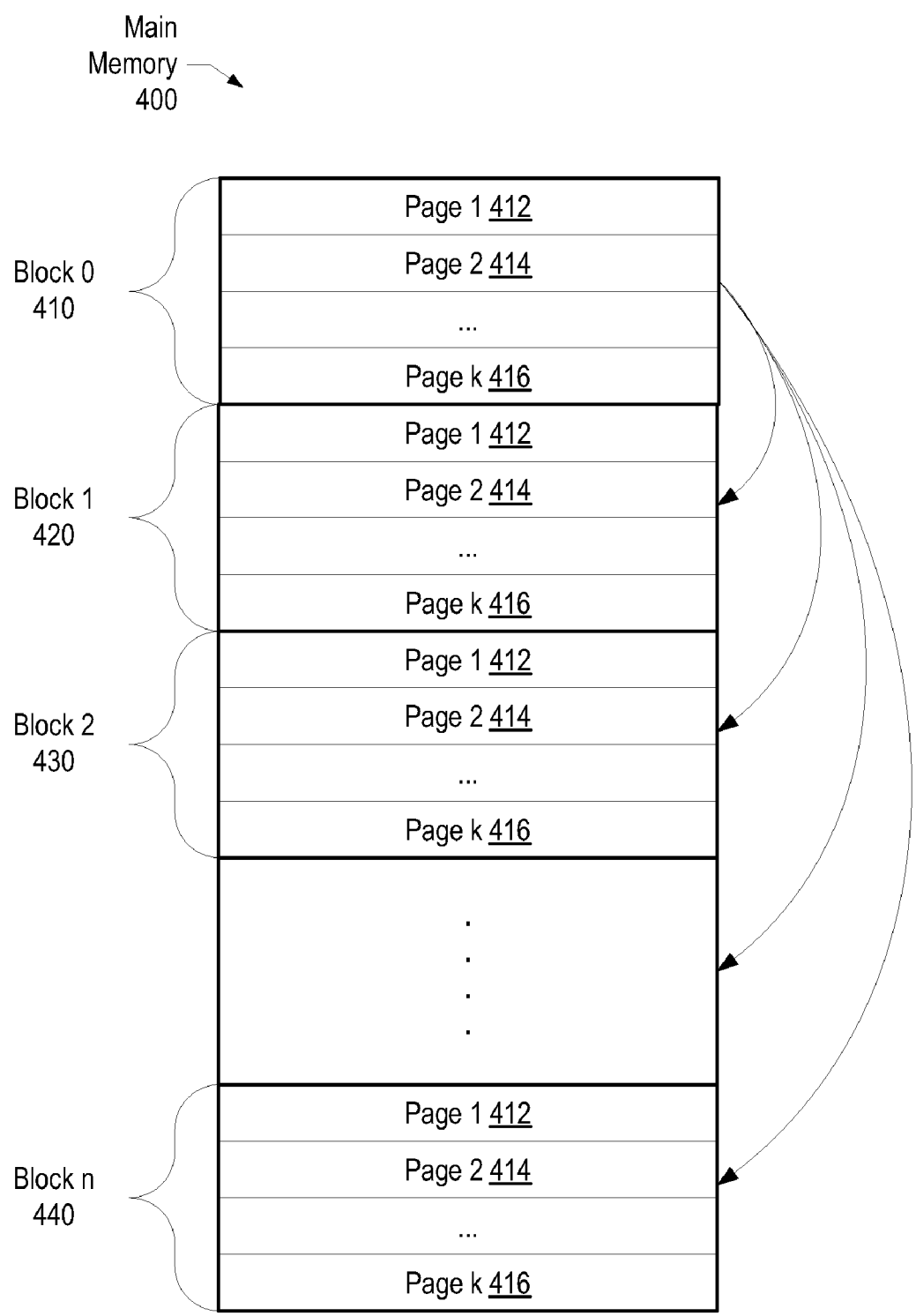
FIG. 4 is a diagram showing a memory block that is replicated throughout a large memory area.

FIG. 4 is a diagram showing a memory block that is replicated throughout a large memory area (main memory 400). The invention described herein allocates a fixed memory block size when building a test case set to access instruction and data information. During the building process an initial memory block, which is the size of the allocated fixed memory block size, is loaded with the data and instruction information (block 0 410). In order to fully test main memory 400, however, the invention described herein replicates block 0 410 throughout main memory 400, which are blocks 1 420, 2 230, and n 440. As can be seen, block 0 410 includes pages 1 412 through k 416, which are replicated in blocks 1 420 through n 440.

Since multiple memory blocks cover main memory 400, a test case executor re-executes the test case set and changes real addresses in a TLB, which references the replicated memory blocks one at a time, after each execution in order to test each of blocks 0 410 through n 440 using the same test case set.

Figure 5:
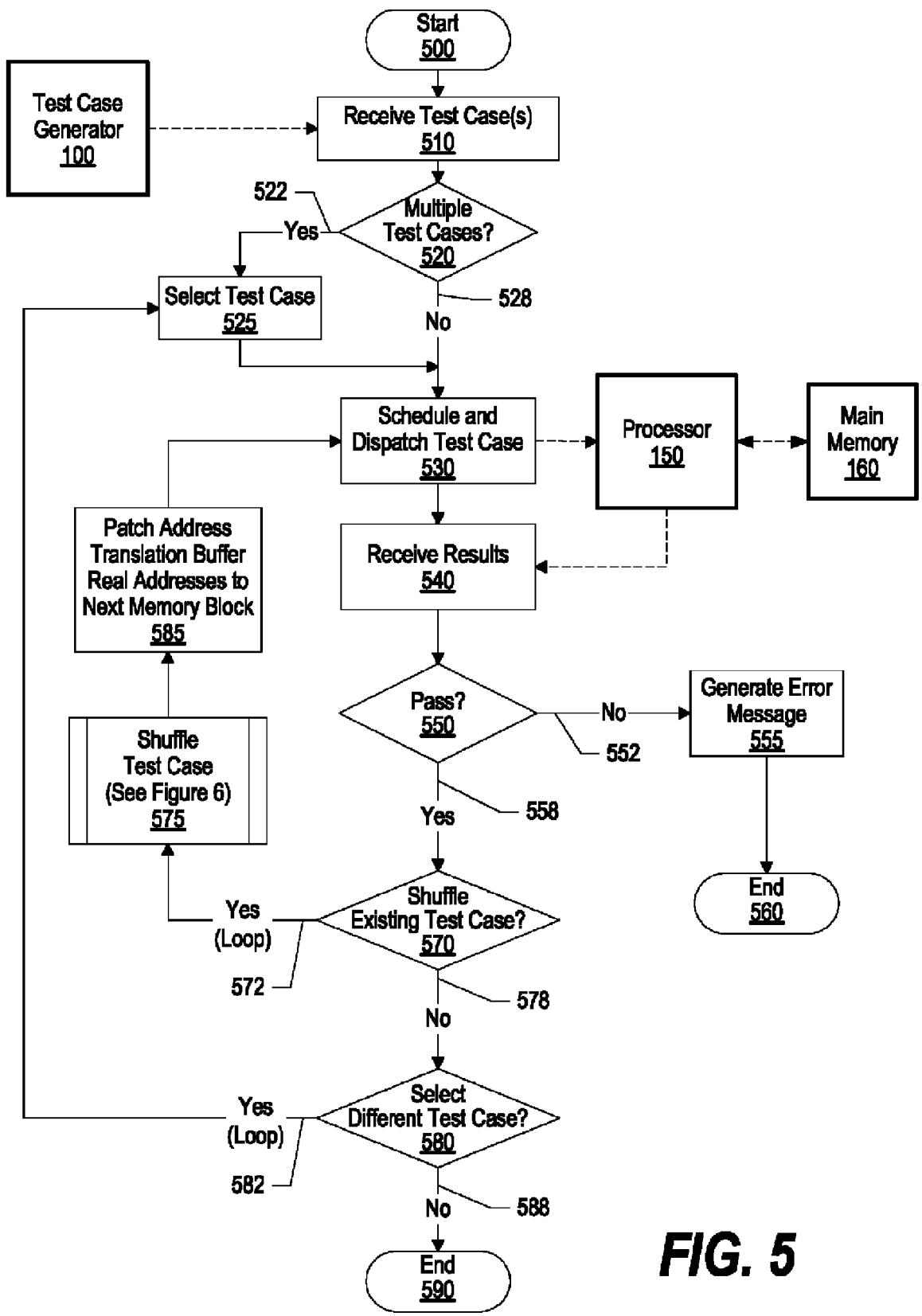
FIG. 5 is a flowchart showing steps taken in shuffling a test case's instruction order in order to efficiently test a processor.

FIG. 5 is a flowchart showing steps taken in shuffling a test case's instruction order in order to efficiently test a processor. Processing commences at 500, whereupon processing receives one or more test cases from test case generator 100 at step 510. Each test case includes multiple sub test cases as previously described herein.

A determination is made as to whether processing received multiple test cases (decision 520). If processing received multiple test cases, decision 520 branches to "Yes" branch 522 whereupon processing selects one of the test cases at step 525. On the other hand, if processing did not receive multiple test cases, decision 520 branches to "No" branch 528, bypassing test case selection step 525.

At step 530, processing schedules and dispatches the test case to processor 150. Processor 150 executes the test case and provides results, which are received at step 540. A determination is made as to whether the results pass (decision 550). If the results do not pass, decision 552 branches to "No" branch 555 whereupon processing generates an error message at step 555, and ends at 560.

On the other hand, if the results pass, decision 550 branches to "Yes" branch 558, whereupon a determination is made as to whether to shuffle the selected test case (decision 570). For example, processing may shuffle the selected test case twenty times in order to provide processor 150 with twenty different test case scenarios.

Figure 6:
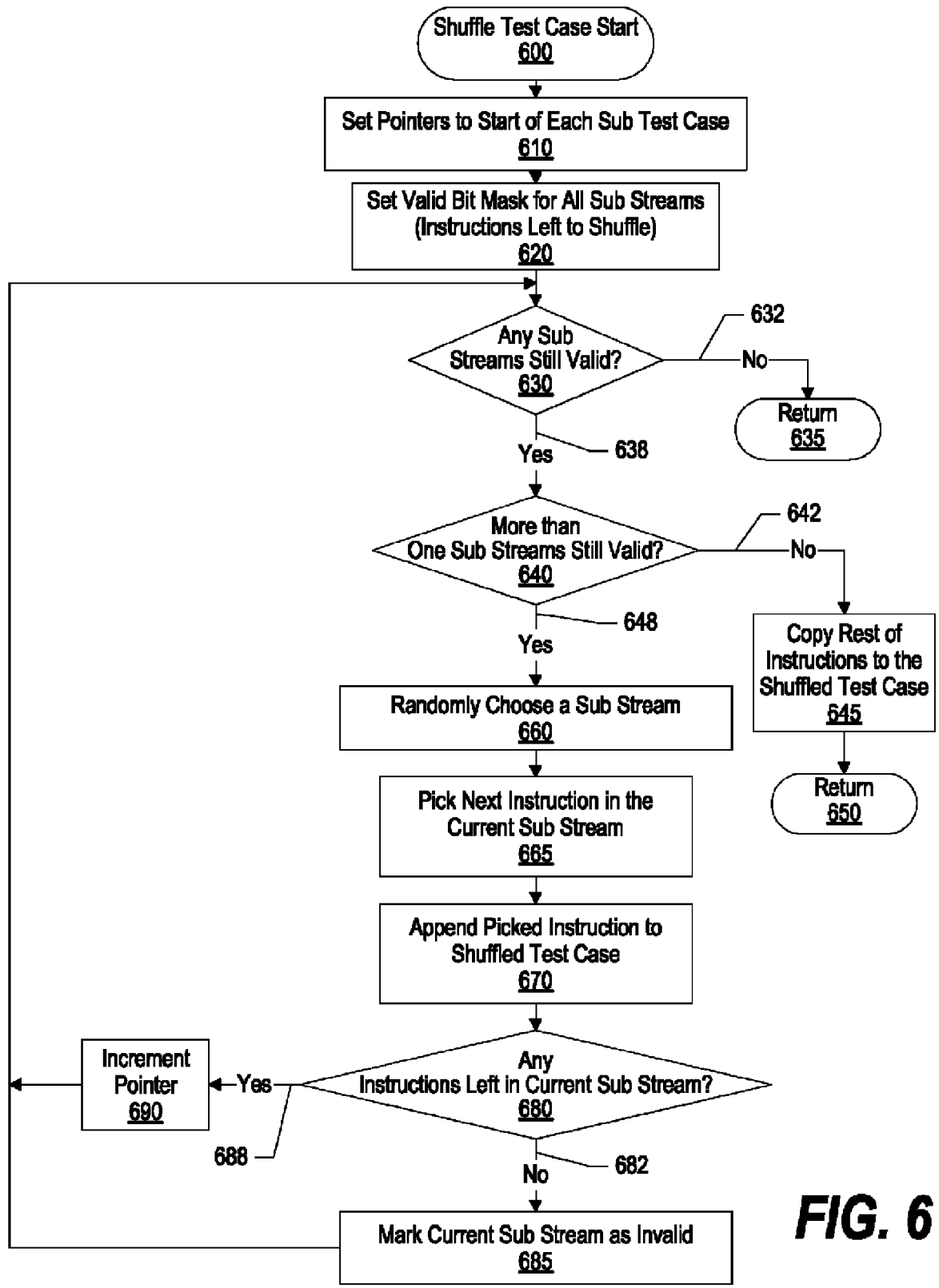
FIG. 6 is a flowchart showing steps taken in shuffling a test case that comprises sub test cases.

If processing should shuffle the selected test case, decision 570 branches to "Yes" branch 572, which loops back to shuffle the test case in accordance with the invention described herein (pre-defined process block 575, see FIG. 6 and corresponding text for further details). Once shuffled, processing patches (modifies) the real addresses within the address translation buffer to reference the real addresses to a different (replicated) memory block (step 585). Processing then schedules and dispatches the shuffled test case to processor 150. This looping continues until processing has finished shuffling the selected test case, at which point decision 570 branches to "No" branch 578.

A determination is made as to whether to select a different test case if test case generator 100 provided multiple test cases (decision 580). If processing should select a different test case, decision 580 branches to "Yes" branch 582, which loops back to select, shuffle, and process the different test case. This looping continues until each test case has been selected and sufficiently shuffled, at which point decision 580 branches to "No" branch 588 whereupon processing ends at 590.

FIG. 6 is a flowchart showing steps taken in shuffling a test case that comprises sub test cases. Processing commences at 600, whereupon processing sets pointers to each of the sub test case's first instruction (step 610). At step 620, processing sets a valid bit mask for all sub streams (i.e. sub test cases), which are instructions within the sub test cases that are left to shuffle.

A determination is made as to whether there are any sub streams that are valid (decision 630). If there are not any sub streams that are valid, decision 630 branches to "No" branch 632 whereupon processing returns at 635. On the other hand, if there are any valid sub streams, decision 630 branches to "Yes" branch 638 whereupon a determination is made as to whether there is more than one valid sub stream still valid (decision 640). If there is not more than one valid sub stream still valid, decision 640 branches to "No" branch 642 whereupon processing copies the rest of the instructions in the valid sub stream to the shuffled test case (step 645), and returns at 650.

On the other hand, if there is more than one valid sub stream, which is typically the case at the beginning of the shuffling process, decision 640 branches to "Yes" branch 648 whereupon processing randomly selects one of the valid sub streams at step 660. At step 665, processing picks the instruction corresponding to the selected sub stream's pointer location and, at step 670, processing appends the picked instruction to the shuffled test case.

A determination is made as to whether there are any instructions left in the currently selected sub stream (decision 680). If there are not any instructions left in the selected sub stream, decision 680 branches to "No" branch 682 whereupon processing marks the selected sub stream invalid (step 685). On the other hand, if there are instructions left in the current sub stream, decision 680 branches to "Yes" branch 688 whereupon processing increments the selected sub stream's pointer at step 690, and loops back to continue to shuffle instructions. This continues until each of the instructions in each of the sub streams are appended to the test case, at which point processing returns at 650.

Figure 7:
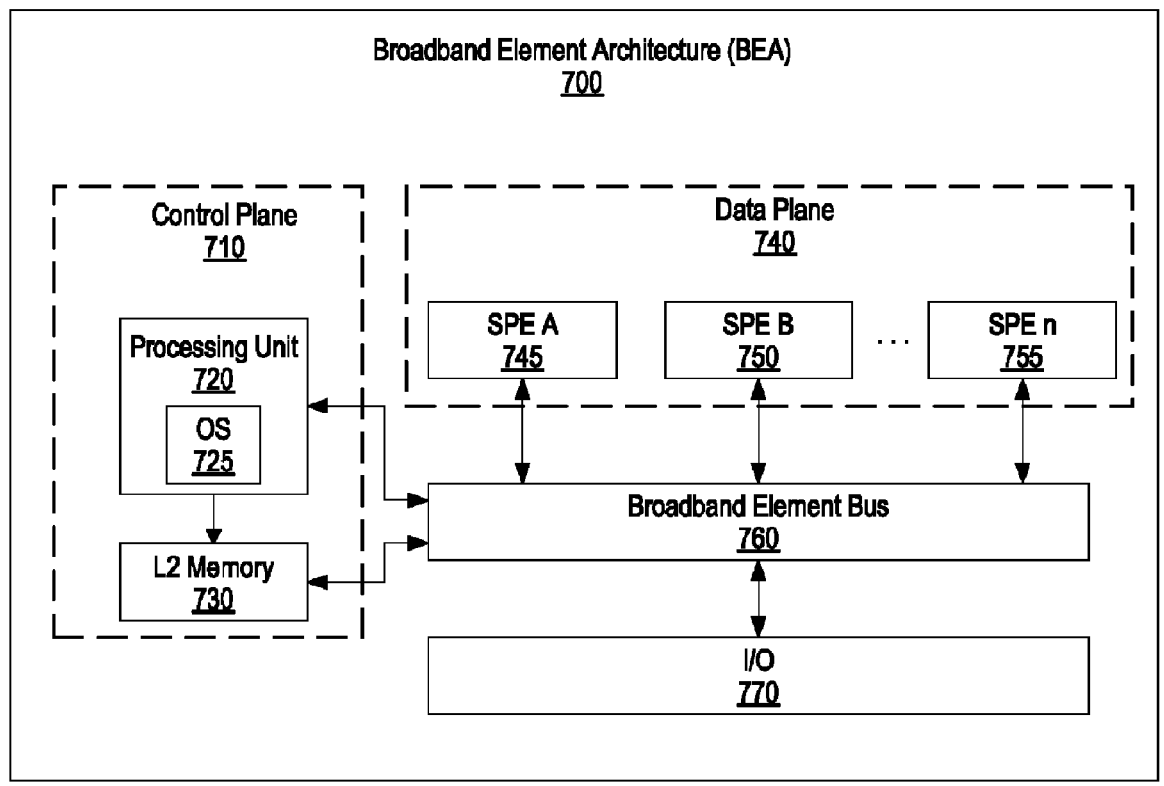
FIG. 7 is a diagram showing a broadband element architecture which includes a plurality of heterogeneous processors capable of implementing the invention described herein.

FIG. 7 is a diagram showing a broadband element architecture which includes a plurality of heterogeneous processors capable of implementing the invention described herein. The heterogeneous processors share a common memory and a common bus. Broadband element architecture (BEA) 700 sends and receives information to/from external devices through input output 770, and distributes the information to control plane 710 and data plane 740 using processor element bus 760. Control plane 710 manages BEA 700 and distributes work to data plane 740.

Control plane 710 includes processing unit 720 which runs operating system (OS) 725. For example, processing unit 720 may be a Power PC core that is embedded in BEA 700 and OS 725 may be a Linux operating system. Processing unit 720 manages a common memory map table for BEA 700. The memory map table corresponds to memory locations included in BEA 700, such as L2 memory 730 as well as non-private memory included in data plane 740.

Data plane 740 includes Synergistic processing element's (SPE) 745, 750, and 755. Each SPE is used to process data information and each SPE may have different instruction sets. For example, BEA 700 may be used in a wireless communications system and each SPE may be responsible for separate processing tasks, such as modulation, chip rate processing, encoding, and network interfacing. In another example, each SPE may have identical instruction sets and may be used in parallel to perform operations benefiting from parallel processes. Each SPE includes a synergistic processing unit (SPU) which is a processing core, such as a digital signal processor, a microcontroller, a microprocessor, or a combination of these cores.

SPE 745, 750, and 755 are connected to processor element bus 760, which passes information between control plane 710, data plane 740, and input/output 770. Bus 760 is an on-chip coherent multi-processor bus that passes information between I/O 770, control plane 710, and data plane 740. Input/output 770 includes flexible input-output logic which dynamically assigns interface pins to input output controllers based upon peripheral devices that are connected to BEA 700.

Figure 8:
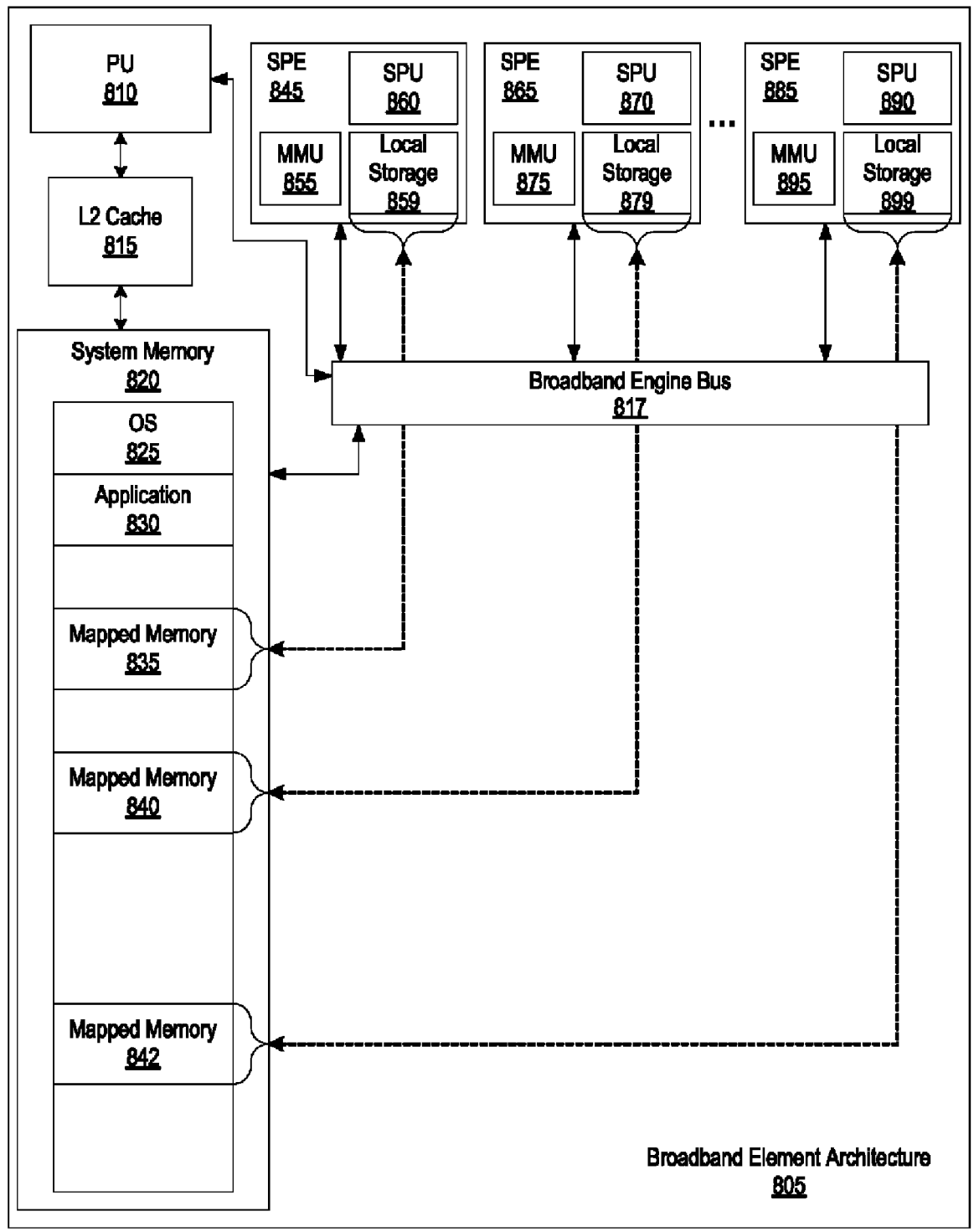
FIG. 8 is a block diagram illustrating a processing element having a main processor and a plurality of secondary processors sharing a system memory.

FIG. 8 is a block diagram illustrating a processing element having a main processor and a plurality of secondary processors sharing a system memory. Broadband Element Architecture (BEA) 805 includes processing unit (PU) 810, which, in one embodiment, acts as the main processor and runs the operating system. Processing unit 810 may be, for example, a Power PC core executing a Linux operating system. BEA 805 also includes a plurality of synergistic processing elements (SPEs) such as SPEs 845 through 885. Each SPE includes a synergistic processing unit (SPU) that act as secondary processing units to PU 810, a memory storage unit, and local storage. For example, SPE 845 includes SPU 860, MMU 855, and local storage 859; SPE 865 includes SPU 870, MMU 875, and local storage 879; and SPE 885 includes SPU 890, MMU 895, and local storage 899.

In one embodiment, the SPEs process data under the control of PU 810. The SPEs may be, for example, digital signal processing cores, microprocessor cores, micro controller cores, etc., or a combination of the above cores. In one embodiment, each one of the local stores is a storage area associated with a particular SPU. Each SPU can configure its local store as a private storage area, a shared storage area, or an SPU's local store may be partly private and partly shared.

For example, if an SPU requires a substantial amount of local memory, the SPU may allocate 100% of its local store to private memory accessible only by that SPU. If, on the other hand, an SPU requires a minimal amount of local memory, the SPU may allocate 10% of its local store to private memory and the remaining 90% to shared memory. The shared memory is accessible by PU 810 and by the other SPEs. An SPU may reserve part of its local store in order for the SPU to have fast, guaranteed access to some memory when performing tasks that require such fast access. The SPU may also reserve some of its local store as private when processing sensitive data, as is the case, for example, when the SPU is performing encryption/decryption.

The MMUs are responsible for transferring data between an SPU's local store and the system memory. In one embodiment, an MMU includes a direct memory access (DMA) controller configured to perform this function.

Each SPE may be set up to perform a different task, and accordingly, in one embodiment, each SPE may be accessed using different instruction sets. If BEA 805 is being used in a wireless communications system, for example, each SPE may be responsible for separate processing tasks, such as modulation, chip rate processing, encoding, network interfacing, etc. In another embodiment, each SPE may have identical instruction sets and may be used in parallel to perform operations benefiting from parallel processes.

The shared portion of the SPEs' local stores may be accessed by PU 810 as well as by the other SPEs by mapping each shared region to system memory 820. In one embodiment, PU 810 manages the memory map for the common system memory 820. The memory map table may include PU 810's L2 Cache 815, system memory 820, as well as the SPEs' shared local stores.

A portion of system memory 820 as shown is occupied by the operating system (OS 825). System Memory 825 also contains data 840, which represents data to be processed by SPU 810 as well as by the SPEs. In one embodiment, a process executing on the PU receives a request for a task involving the processing of large data. The PU first determines an optimum method for performing the task as well as an optimum placement of the data in common system memory 820. The PU may then initiate a transfer of the data to be processed from disk 835 to system memory 820. In one embodiment, the PU arranges the data in system memory 825 in data blocks the size of the registers of the SPEs. In one embodiment, the SPEs may have 128 registers, each register being 128 bits long.

The PU then searches for available SPEs and assigns blocks of data to any available SPEs for processing of the data. The SPEs can access the common system memory (through a DMA command, for example) transfer the data to the SPEs' local store, and perform the assigned operations. After processing the data, the SPEs may transfer the data (using DMA again, for example) back to common system memory 820. This procedure may be repeated as SPEs become available until all the data blocks have been processed.

Figure 9:
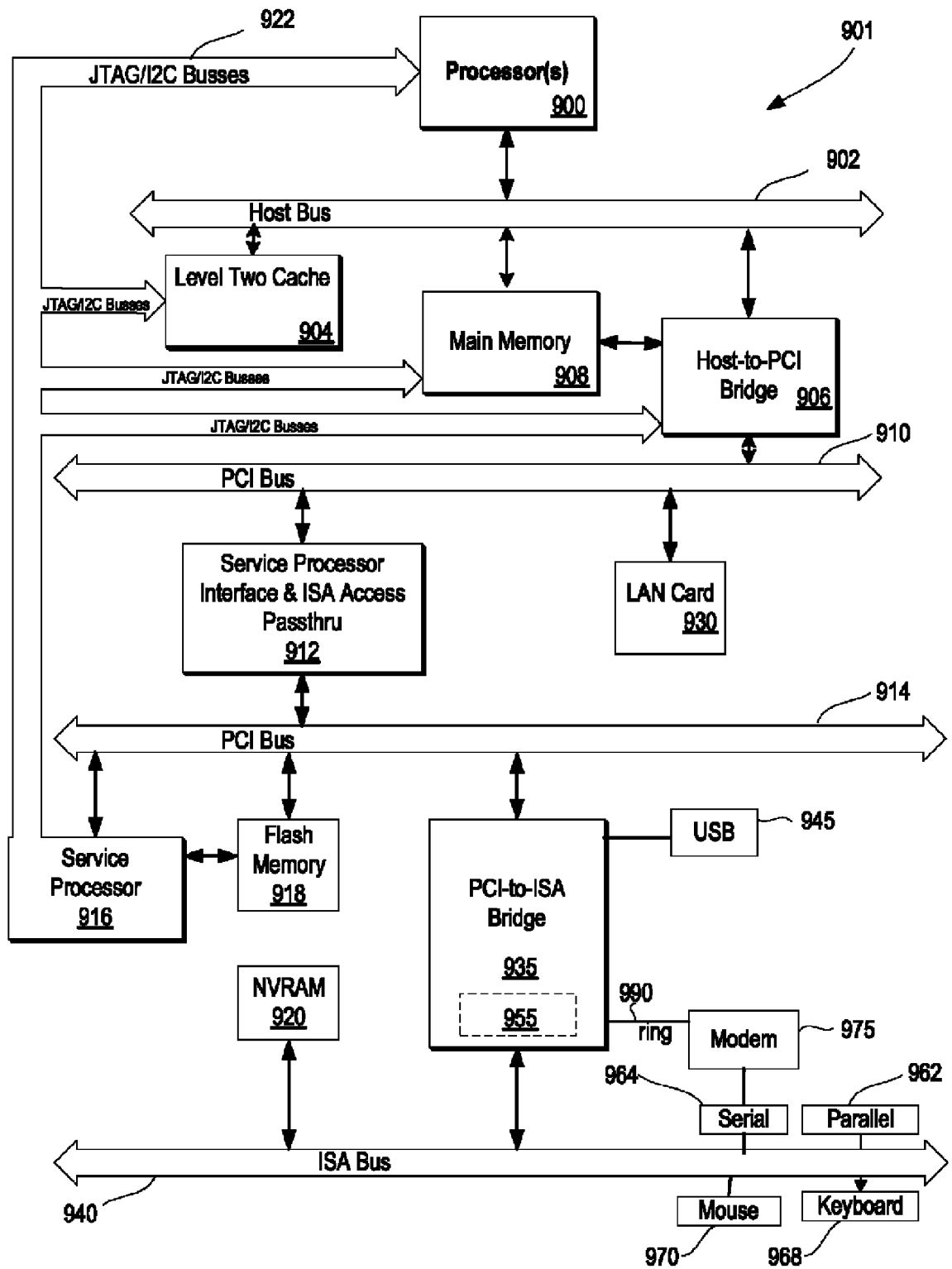
FIG. 9 is a block diagram of a computing device capable of implementing the present invention.

FIG. 9 illustrates information handling system 901 which is a simplified example of a computer system capable of performing the computing operations described herein. Computer system 901 includes processor 900 which is coupled to host bus 902. A level two (L2) cache memory 904 is also coupled to host bus 902. Host-to-PCI bridge 906 is coupled to main memory 908, includes cache memory and main memory control functions, and provides bus control to handle transfers among PCI bus 910, processor 900, L2 cache 904, main memory 908, and host bus 902. Main memory 908 is coupled to Host-to-PCI bridge 906 as well as host bus 902. Devices used solely by host processor(s) 900, such as LAN card 930, are coupled to PCI bus 910. Service Processor Interface and ISA Access Pass-through 912 provides an interface between PCI bus 910 and PCI bus 914. In this manner, PCI bus 914 is insulated from PCI bus 910. Devices, such as flash memory 918, are coupled to PCI bus 914. In one implementation, flash memory 918 includes BIOS code that incorporates the necessary processor executable code for a variety of low-level system functions and system boot functions.

PCI bus 914 provides an interface for a variety of devices that are shared by host processor(s) 900 and Service Processor 916 including, for example, flash memory 918. PCI-to-ISA bridge 935 provides bus control to handle transfers between PCI bus 914 and ISA bus 940, universal serial bus (USB) functionality 945, power management functionality 955, and can include other functional elements not shown, such as a real-time clock (RTC), DMA control, interrupt support, and system management bus support. Nonvolatile RAM 920 is attached to ISA Bus 940. Service Processor 916 includes JTAG and I2C busses 922 for communication with processor(s) 900 during initialization steps. JTAG/I2C busses 922 are also coupled to L2 cache 904, Host-to-PCI bridge 906, and main memory 908 providing a communications path between the processor, the Service Processor, the L2 cache, the Host-to-PCI bridge, and the main memory. Service Processor 916 also has access to system power resources for powering down information handling device 901.

Peripheral devices and input/output (I/O) devices can be attached to various interfaces (e.g., parallel interface 962, serial interface 964, keyboard interface 968, and mouse interface 970 coupled to ISA bus 940. Alternatively, many I/O devices can be accommodated by a super I/O controller (not shown) attached to ISA bus 940.

In order to attach computer system 901 to another computer system to copy files over a network, LAN card 930 is coupled to PCI bus 910. Similarly, to connect computer system 901 to an ISP to connect to the Internet using a telephone line connection, modem 975 is connected to serial port 964 and PCI-to-ISA Bridge 935.

While FIG. 9 shows one information handling system that employs processor(s) 900, the information handling system may take many forms. For example, information handling system 901 may take the form of a desktop, server, portable, laptop, notebook, or other form factor computer or data processing system. Information handling system 901 may also take other form factors such as a personal digital assistant (PDA), a gaming device, ATM machine, a portable telephone device, a communication device or other devices that include a processor and memory.

One of the preferred implementations of the invention is a client application, namely, a set of instructions (program code) in a code module that may, for example, be resident in the random access memory of the computer. Until required by the computer, the set of instructions may be stored in another computer memory, for example, in a hard disk drive, or in a removable memory such as an optical disk (for eventual use in a CD ROM) or floppy disk (for eventual use in a floppy disk drive). Thus, the present invention may be implemented as a computer program product for use in a computer. In addition, although the various methods described are conveniently implemented in a general purpose computer selectively activated or reconfigured by software, one of ordinary skill in the art would also recognize that such methods may be carried out in hardware, in firmware, or in more specialized apparatus constructed to perform the required method steps.

While particular embodiments of the present invention have been shown and described, it will be obvious to those skilled in the art that, based upon the teachings herein, that changes and modifications may be made without departing from this invention and its broader aspects. Therefore, the appended claims are to encompass within their scope all such changes and modifications as are within the true spirit and scope of this invention. Furthermore, it is to be understood that the invention is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use in the claims of definite articles.

What is claimed is:

1. A computer-implemented method comprising:
receiving a test case set that tests an initial memory block included in a memory area, the test case set including an initial address translation table to convert one or more virtual addresses to one or more initial real addresses, the one or more virtual addresses called by the test case set and the one or more initial real addresses corresponding to the initial memory block;
executing the test case set using the initial address translation table, wherein the executing includes the test case set calling one or more of the virtual addresses and the initial address translation table identifying one or more of the initial real addresses for which to test the initial memory block;
after the execution of the test case set, modifying the initial real addresses in the initial address translation table to reference a different memory block included in the memory area, the modifying resulting in a modified address translation table that includes the one or more virtual addresses and one or more modified real addresses; and
re-executing the test case set using the modified address translation table, wherein the re-executing includes the test case set calling one or more of the virtual addresses and the modified address translation table identifying one or more of the modified real addresses for which to test the different memory block.

2. The method of claim 1 further comprising:
building the test case set, the building comprising:
allocating a fixed memory block size to build the test case set, a size of the initial memory block equaling the allocated fixed memory block size; and
building the test case set by selecting memory access instructions that reference the initial memory block.

3. The method of claim 1 further comprising:
replicating data included in the initial memory block throughout the memory area, resulting in a plurality of replicated memory blocks; and
re-modifying the modified address translation table and re-executing the test case set in order to test each of the plurality of replicated memory blocks included in the memory area.

4. The method of claim 1 wherein the initial address translation table is selected from the group consisting of a translation lookaside buffer table and a page table.

5. The method of claim 1 wherein the test case set includes a test case, the method further comprising:
receiving the test case, which includes a first sub test case and a second sub test case, the first sub test case including a first set of instructions organized in a first instruction order and the second sub test case including a second set of instructions organized in a second instruction order;
during the execution of the test case set, the first set of instructions executes in the first instruction order and the second set of instructions executes in the second instruction order;
after the execution, shuffling the test case, which results in a shuffled instruction order within the test case, the shuffled instruction order including one or more of the first set of instructions inserted between one or more of the second set of instructions, wherein the first instruction order relative to the first set of instructions remains the same in the shuffled instruction order, and wherein the second instruction order relative to the second set of instructions remains the same in the shuffled instruction order; and
during the re-execution of the test case set, executing the shuffled test case.

6. The method of claim 1 wherein, prior to receiving the test case set, the method further comprises:
building the test case, the building comprising:
identifying a first set of processor resources and a second set of processor resources, the first set of processor resources being different than the second set of processor resources;
allocating the first set of processor resources to a first sub test case and allocating the second set of processor resources to a second sub test case;
building the first sub test case using the first set of instructions, wherein the first set of instructions correspond to the first set of processor resources;
building the second sub test case using the second set of instructions, wherein the second set of instructions correspond to the second set of processor resources; and
including the built first sub test case and the built second sub test case into the test case.

7. The method of claim 1 wherein executing the test case set and re-executing the test case set produce identical results.

8. An information handling system comprising:
one or more processors;
a memory accessible by the processors;
one or more nonvolatile storage devices accessible by the processors; and
a set of instructions stored in the memory, wherein one or more of the processors executes the set of instructions in order to perform actions of:
  receiving a test case set that tests an initial memory block included in a memory area, the test case set including an initial address translation table to convert one or more virtual addresses to one or more initial real addresses, the one or more virtual addresses called by the test case set and the one or more initial real addresses corresponding to the initial memory block;
  executing the test case set using the initial address translation table, wherein the executing includes the test case set calling one or more of the virtual addresses and the initial address translation table identifying one or more of the initial real addresses for which to test the initial memory block;
  after the execution of the test case set, modifying the initial real addresses in the initial address translation table to reference a different memory block included in the memory area, the modifying resulting in a modified address translation table that includes the one or more virtual addresses and one or more modified real addresses; and
  re-executing the test case set using the modified address translation table, wherein the re-executing includes the test case set calling one or more of the virtual addresses and the modified address translation table identifying one or more of the modified real addresses for which to test the different memory block.

9. The information handling system of claim 8 further comprising an additional set of instructions in order to perform actions of:
  building the test case set, the building comprising:
    allocating a fixed memory block size to build the test case set, a size of the initial memory block equaling the allocated fixed memory block size; and
    building the test case set by selecting memory access instructions that reference the initial memory block.

10. The information handling system of claim 8 further comprising an additional set of instructions in order to perform actions of:
  replicating data included in the initial memory block throughout the memory area, resulting in a plurality of replicated memory blocks; and
  re-modifying the modified address translation table and re-executing the test case set in order to test each of the plurality of replicated memory blocks included in the memory area.

11. The information handling system of claim 8 wherein the initial address translation table is selected from the group consisting of a translation lookaside buffer table and a page table.

12. The information handling system of claim 8 wherein the test case set includes a test case, the information handling system further comprising an additional set of instructions in order to perform actions of:
  receiving the test case, which includes a first sub test case and a second sub test case, the first sub test case including a first set of instructions organized in a first instruction order and the second sub test case including a second set of instructions organized in a second instruction order;
  during the execution of the test case set, the first set of instructions executes in the first instruction order and the second set of instructions executes in the second instruction order;
  after the execution, shuffling the test case, which results in a shuffled instruction order within the test case, the shuffled instruction order including one or more of the first set of instructions inserted between one or more of the second set of instructions, wherein the first instruction order relative to the first set of instructions remains the same in the shuffled instruction order, and wherein the second instruction order relative to the second set of instructions remains the same in the shuffled instruction order; and
  during the re-execution of the test case set, executing the shuffled test case.

13. The information handling system of claim 8 wherein, prior to receiving the test case set, the information handling system further comprises an additional set of instructions in order to perform actions of:
  building the test case, the building comprising:
    identifying a first set of processor resources and a second set of processor resources, the first set of processor resources being different than the second set of processor resources;
    allocating the first set of processor resources to a first sub test case and allocating the second set of processor resources to a second sub test case;
    building the first sub test case using the first set of instructions, wherein the first set of instructions correspond to the first set of processor resources;
    building the second sub test case using the second set of instructions, wherein the second set of instructions correspond to the second set of processor resources; and
    including the built first sub test case and the built second sub test case into the test case.

14. A computer program product stored on a computer operable media, the computer operable media containing instructions for execution by a computer, which, when executed by the computer, cause the computer to implement a method of processing test cases, the method comprising:
  receiving a test case set that tests an initial memory block included in a memory area, the test case set including an initial address translation table to convert one or more virtual addresses to one or more initial real addresses, the one or more virtual addresses called by the test case set and the one or more initial real addresses corresponding to the initial memory block;
  executing the test case set using the initial address translation table, wherein the executing includes the test case set calling one or more of the virtual addresses and the initial address translation table identifying one or more of the initial real addresses for which to test the initial memory block;
  after the execution of the test case set, modifying the initial real addresses in the initial address translation table to reference a different memory block included in the memory area, the modifying resulting in a modified address translation table that includes the one or more virtual addresses and one or more modified real addresses; and
  re-executing the test case set using the modified address translation table, wherein the re-executing includes the test case set calling one or more of the virtual addresses and the modified address translation table identifying one or more of the modified real addresses for which to test the different memory block.

15. The computer program product of claim 14 wherein the method further comprises:
  building the test case set, the building comprising:
    allocating a fixed memory block size to build the test case set, a size of the initial memory block equaling the allocated fixed memory block size; and
    building the test case set by selecting memory access instructions that reference the initial memory block.

16. The computer program product of claim 14 wherein the method further comprises:
  replicating data included in the initial memory block throughout the memory area, resulting in a plurality of replicated memory blocks; and
  re-modifying the modified address translation table and re-executing the test case set in order to test each of the plurality of replicated memory blocks included in the memory area.

17. The computer program product of claim 14 wherein the initial address translation table is selected from the group consisting of a translation lookaside buffer table and a page table.

18. The computer program product of claim 14 wherein the test case set includes a test case, the method further comprising:
  receiving the test case, which includes a first sub test case and a second sub test case, the first sub test case including a first set of instructions organized in a first instruction order and the second sub test case including a second set of instructions organized in a second instruction order;
  during the execution of the test case set, the first set of instructions executes in the first instruction order and the second set of instructions executes in the second instruction order;
  after the execution, shuffling the test case, which results in a shuffled instruction order within the test case, the shuffled instruction order including one or more of the first set of instructions inserted between one or more of the second set of instructions, wherein the first instruction order relative to the first set of instructions remains the same in the shuffled instruction order, and wherein the second instruction order relative to the second set of instructions remains the same in the shuffled instruction order; and
  during the re-execution of the test case set, executing the shuffled test case.

19. The computer program product of claim 14 wherein, prior to receiving the test case set, the method further comprises:
  building the test case, the building comprising:
    identifying a first set of processor resources and a second set of processor resources, the first set of processor resources being different than the second set of processor resources;
    allocating the first set of processor resources to a first sub test case and allocating the second set of processor resources to a second sub test case;
    building the first sub test case using the first set of instructions, wherein the first set of instructions correspond to the first set of processor resources;
    building the second sub test case using the second set of instructions, wherein the second set of instructions correspond to the second set of processor resources; and
    including the built first sub test case and the built second sub test case into the test case.

20. The computer program product of claim 14 wherein executing the test case set and re-executing the test case set produce identical results.

* * * * *